(12) United States Patent
Tyan et al.

(10) Patent No.: US 6,905,788 B2
(45) Date of Patent: Jun. 14, 2005

(54) STABILIZED OLED DEVICE

(75) Inventors: Yuan-Sheng Tyan, Webster, NY (US); Tukaram K. Hatwar, Penfield, NY (US); Joel D. Shore, Rochester, NY (US); Giuseppe Farruggia, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/661,121

(22) Filed: Sep. 12, 2003

(65) Prior Publication Data

US 2005/0058852 A1 Mar. 17, 2005

(51) Int. Cl.[7] .............................................. H05B 33/14
(52) U.S. Cl. ...................... 428/690; 428/917; 313/504; 313/506; 313/112; 313/113; 257/98
(58) Field of Search ................................ 428/690, 917; 313/504, 506, 112, 113; 257/98

(56) References Cited

U.S. PATENT DOCUMENTS

| | | | |
|---|---|---|---|
| 4,769,292 A | 9/1988 | Tang et al. | |
| 5,126,214 A | 6/1992 | Tokailin et al. | |
| 6,692,846 B2 * | 2/2004 | Hatwar et al. | 428/690 |
| 2003/0068524 A1 | 4/2003 | Hatwar | |

OTHER PUBLICATIONS

Takada et al., "Control of emission characteristics in organic thin–film electroluminescent diodes using an optical–microcavity structure", Appl. Phys. Lett. 63 (15), Oct. 11, 1993, p. 2032–2034.*
Dirr et al., "Luminescence enhancement in microcavity organi multilayer structures", Synthetic Metals, 91 (1997), pp. 53–56.*
Tang et al. in Applied Physics Letters vol. 51, No. 12, p. 913–915, (1987).
Journal of Applied Physics, vol. 65, No. 9, p. 3610–3616, (1989).

* cited by examiner

Primary Examiner—Dawn Garrett
(74) Attorney, Agent, or Firm—Raymond L. Owens

(57) ABSTRACT

A stabilized OLED device for emitting light of a specific color includes a metallic anode and a metallic cathode spaced from the metallic anode. The device also includes a light-emitting layer including a host and a dopant, the dopant selected to produce light having a spectrum including light of the specific color, and a stabilizer provided in one of the device layers which improves the useful lifetime of the OLED device, wherein the stabilizer has an emission spectrum different from that of the light-emitting layer. One of the electrode layers is semitransparent and the other one is substantially opaque and reflective such that the stabilized OLED device forms a microcavity that emits a narrow band light with the specific color.

10 Claims, 3 Drawing Sheets

STABILIZED OLED DEVICE

CROSS REFERENCE TO RELATED APPLICATIONS

Reference is made to commonly assigned U.S. patent application Ser. No. 09/651,624 filed Aug. 30, 2000 by Tukaram K. Hatwar, entitled "White Organic Electroluminescent Devices with Improved Stability and Efficiency" now U.S. Pat. No. 6,696,177 issued Feb. 24, 2004; Ser. No. 09/930,050 filed Aug. 15, 2001 by Tukaram K. Hatwar, entitled "White Organic Electroluminescent Devices with Improved Efficiency", now U.S. Pat. No. 6,627,333 issued Sep. 30, 2003; Ser. No. 10/191,251 filed July, 2002 by Tukaram K. Hatwar, entitled "White Organic Light-Emitting Devices Using Rubrene Layer", now U.S. Pat. No. 6,720,092 issued Apr. 13, 2004; and Ser. No. 10/346,424 filed Jan. 17, 2003 by Yuan-Sheng Tyan et al., entitled "Microcavity OLED Devices"; the disclosures of which are incorporated herein by reference.

FIELD OF THE INVENTION

The present invention relates to organic electroluminescent (EL) devices. More specifically, the present invention relates to an organic EL device with improved stability, efficiency, and color purity.

BACKGROUND OF THE INVENTION

Organic electroluminescent (EL) devices or organic light-emitting diodes (OLEDs) are electronic devices that emit light in response to an applied potential. Tang et al. in Applied Physics Letters 51, p913, 1987; Journal of Applied Physics, 65, p3610, 1989; and commonly assigned U.S. Pat. No. 4,769,292 demonstrated highly efficient OLEDs. Since then, numerous OLEDs with alternative layer structures, including polymeric materials, have been disclosed and device performance has been improved. For the commercial success of OLEDs, further improvement in devices is needed. One of the key areas that needs further improvement is the operating stability of the devices.

The OLED devices today show a continuous degradation of luminance output with use. This gradual degradation of luminance output is unacceptable for many applications. Many approaches have been attempted to solve this degradation problem. One of the more promising approaches is to dope one of the organic layers with another material, generally referred to as a stabilizer, which stabilizes the devices. U.S. Patent Application Publication 2003/0068524 A1 disclosed improved OLED device stability by incorporating a rubrene dopant in the hole transport layer (HTL) next to a blue light-emitting layer (LEL). The detailed mechanism for this stabilizing effect is not well understood, but one important consequence of this approach is that the rubrene doped HTL also emits light, but with orange color, which combines with the blue light emitted from LEL to result in a white light emission from the OLED device. When a stabilizing dopant is added to an OLED device, the OLED device is stabilized, since the emitted light from the stabilizers most likely has a quite different spectrum from that of the OLED device. As a result, the emitted light from the OLED device is contaminated in color by the emission from the stabilizer. This contamination may not be acceptable for many practical applications.

One of the many approaches to achieve a full color OLED display is to use a color conversion approach. Color conversion OLED has been described by Tokailin et al. in commonly assigned U.S. Pat. No. 5,126,214. The color conversion OLED device is provided with a color conversion layer that includes a fluorescent material responsive to the color of light emitted by the light-emitting layer and is capable of changing the wavelength of the light and thereby re-emitting different colored light. It can be particularly useful to form an OLED device that generates light of a single hue (e.g., blue light) and include color conversion layers that convert the generated light into light of one or more different hues (e.g., green, red) that will be perceived by a viewer. Thus, it is possible to construct a full color OLED device with a light-emitting layer that produces only a single hue of light. Most commonly, the OLED display is designed to emit blue light. The subpixels designed to emit light of other hues are provided with florescent materials that can absorb the blue light emitted from the OLED and re-emit the other desired colors. With this approach, full color displays have many advantages, however, one of the key problems is that blue emitting OLEDs are generally the least stable and least efficient of OLED devices.

There is therefore a need to provide stable OLED devices and, in particular, blue light-emitting OLED devices without color contamination.

SUMMARY OF THE INVENTION

It is therefore an object of the present invention to provide an OLED device with improved stability and color quality.

This object is achieved by a stabilized OLED device for emitting light of a specific color, comprising:

a) a metallic anode and a metallic cathode spaced from the anode;

b) a light-emitting layer including a host and a dopant disposed between the anode and the cathode, the dopant being selected to produce light having a spectrum containing light of the specific color;

c) a stabilizer provided in one of the device layers which improves the useful lifetime of the OLED device, wherein the stabilizer has an emission spectrum different from that of the light-emitting layer, and d) wherein one of the electrode layers is semitransparent and the other one is substantially opaque and reflective such that the stabilized OLED device forms a microcavity that emits a narrow band light with the specific color.

The preferred material for the semitransparent electrode layer includes Ag or Au, or alloys thereof, and the material for the opaque and reflective electrode layer preferably includes Ag, Au, Al, Mg, or Ca, or alloys thereof.

ADVANTAGES

It is an advantage of the present invention that it provides a monocolor OLED device with improved stability and performance. It is a further advantage of the present invention that it permits the use in an OLED device of stabilizing materials that have emissions at unwanted wavelengths without such unwanted emissions affecting the desired emissions. It is a further advantage of the present invention that it provides a light source for a color-conversion type OLED display with improved efficiency and stability. It is a still further advantage of the present invention that it provides for the use of a full-color OLED display with improvements from the microcavity effect but with reduced angular dependence that commonly affects microcavities.

Figure 1:
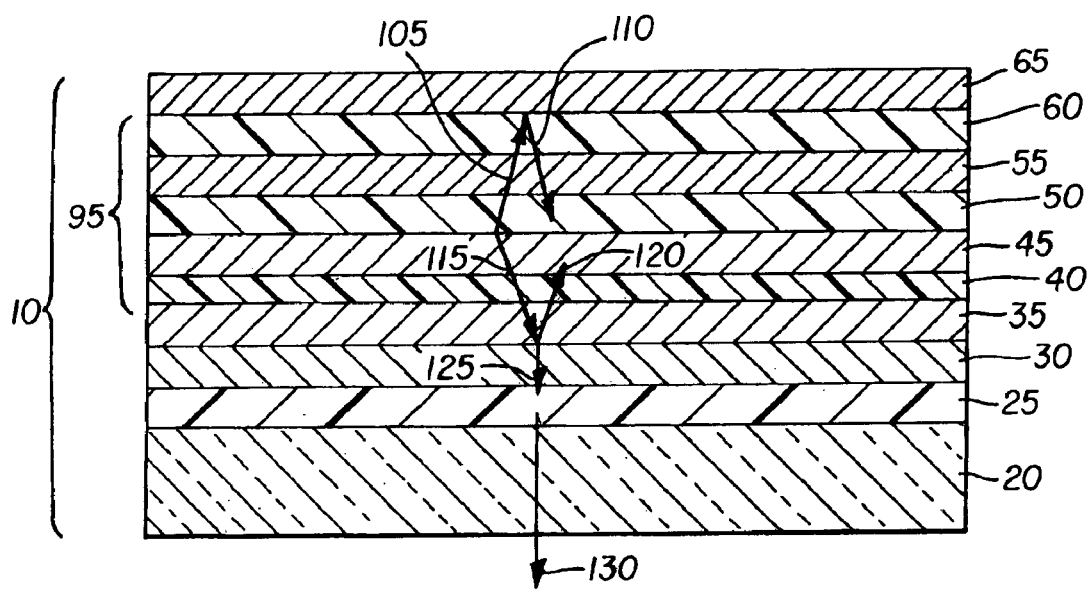
FIG. 1 is a cross-sectional view of a pixel of an OLED device according to a first embodiment of the present invention, and also schematically showing the effect of light emission in a resulting microcavity.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A colored OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any hue or combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel, which can be independently addressable to emit light of a specific color. For example, a blue subpixel is that portion of a pixel, which can be addressed to emit blue light. In a full-color display, a pixel generally comprises three primary-color subpixels, namely blue, green, and red. For the purposes of the present invention, the terms "pixel" and "subpixel" will be used interchangeably. The term "pitch" is used to designate the distance separating two pixels or subpixels in a display panel. Thus, a subpixel pitch means the separation between two subpixels.

The term "microcavity OLED device" is used to designate an OLED device that comprises an organic EL element disposed between two reflecting mirrors having over 30% reflectivity. In most cases one of the reflecting mirror is essentially opaque and the other one is semitransparent having an optical density less than 1.0. The light-emitting element can comprise one or more organic layers that emits light under applied voltage during the operation of the OLED device. The two reflecting mirrors form a Fabry-Perot microcavity that strongly affects the emission characteristics of the OLED device. Emission near the wavelength corresponding to the resonance wavelength of the cavity is enhanced and those with other wavelengths are suppressed. The net result is a significant narrowing of the bandwidth of the emitted light and a significant enhancement of its intensity. Most microcavity OLED devices in the prior art used a quarter-wave stack (QWS) as the semitransparent mirror. The QWS, however, is complicated in structure and expensive. It was discovered quite unexpectedly through extensive modeling and experimental efforts that high performance microcavity OLED devices that enhance the light emission output efficiency and color quality can actually be fabricated using all metallic mirrors. It was discovered that the material selection for both the reflective and the semitransparent metallic electrodes is important and the thickness of the semitransparent metallic electrode is also important. Only a small number of metals, including Ag, Au, Al, Mg, or Ca, or alloys thereof, defined as alloys having at least 50 atomic percent of at least one of these metals, are preferably used as the reflective electrode. When other metals are used, the benefits of luminance output increase and color quality improvement due to microcavity effect are much reduced. Similarly, for the semitransparent electrode only a small number of materials including Ag or Au, or alloys thereof are preferably used. The thickness range of the semitransparent electrode is also limited. Too thin a layer does not provide a significant microcavity effect and too thick a layer reduces the luminance output. In addition, the location of the light-emitting layer within the microcavity also strongly affects the luminance output and needs to be optimized. Only with a proper optimization of all these factors can a microcavity OLED device with emission output efficiency and color quality significantly improved over that of corresponding non-cavity OLED devices be achieved. It was further discovered that an absorption-reducing layer disposed next to the light transmissive electrode layer outside the microcavity further improves the luminance performance of a microcavity device.

Metallic mirrors are simpler in structure and easier to fabricate than a QWS. The use of two metallic mirrors that also function as electrodes eliminates the need for a separate transparent conductive electrode. The sheet conductivity of the semitransparent metallic electrode can be much higher than the transparent conductive electrodes used in the prior art. The increased conductivity reduces Ohmic loss in an OLED device, especially if the device area is large. The emission bandwidths using appropriately designed metallic mirrors are broader than those obtained using QWS and hence the luminance output is increased. On the other hand, the emission bandwidth is still narrow enough to provide excellent color selectivity and color quality, also referred to as chromaticity.

Many approaches have been attempted to improve the operation stability of OLEDs. One of the most successful approaches is to dope one or more of the organic layers in the OLED structure with stabilizers. It was unexpectedly discovered that OLED devices with high luminance efficiency and operational stability can be obtained by doping yellow rubrene dopant, or super rubrene derivative dopants 6,11-diphenyl-5,12-bis(4-(6-methyl-benzothiazol-2-yl) phenyl)naphthacene (DBzR), or 5,6,11,12-tetra(2-naphthyl) naphthacene (NR) in the hole-transporting layer and distyrylamine derivatives blue dopant in the host light-emitting layer. The yellow emission from the doped hole-transporting layer and the blue emission from the host blue light-emitting layer combine to form the white emission from the OLED device. It was discovered unexpectedly that the stability of the blue luminance in these white emitting devices is much improved over OLED devices using the same blue light-emitting layer but with a hole-transporting layer without the yellow dopants. It can therefore be deduced that providing dopants such as yellow rubrene, DBzR, or NR in the hole-transporting layer stabilizes the blue emission from the light-emitting layer. However, doping the hole transport layer with dopants such as yellow rubrene, DBzR, or NR results in the emission of yellow light as well. The OLED device is no longer a blue emitting device. While this approach can be used to produce white light that is useful for many applications, the color contamination makes the stabilized devices not suitable for applications where pure blue light is needed, for example, in color conversion OLED devices.

In accordance with the present invention, an OLED device with an added stabilizer is constructed to have a microcavity structure as described above. The microcavity structure is tuned to have a resonance wavelength corresponding to the specific color desired for the application. The wavelength-selecting and bandwidth-narrowing effect of the microcavity structure effectively suppresses the emission of the undesirable contaminating light from the stabilizing dopant and enables the emission of light of the desired specific color. The microcavity structure can further improve the emission efficiency of the OLED device at the desirable emission wavelength as well as the chromaticity of the emitted color. All these benefits are achieved while maintaining the stabilizing effect of the stabilizer. The present invention is thus effective in providing a stabilized OLED device for emitting light of a specific color, that is, a monochrome OLED device with improved stability, emission efficiency, and chromaticity.

The present invention is also effective in providing improved color conversion OLED display devices. In this embodiment the light-emitting layer can be designed to emit, for example, blue light, and the color conversion layer can be provided to absorb the emitted blue light and re-emit light of a different color. A stabilizing dopant is added to improve the stability of the device. The microcavity structure improves the emission efficiency and chromaticity of the blue emission and, as a result, provides an improved color conversion OLED display device.

Microcavity OLED devices have been reported in the prior art to achieve improved chromaticity and emission efficiency. These microcavity OLED devices, however, have increased viewing angle dependence. Because the resonance of the microcavity changes with viewing angle, the emitted light changes color and intensity with viewing angle, which is undesirable in many applications. In accordance with a preferred embodiment of the present invention, a color conversion display device is constructed using a blue emitting OLED in a microcavity structure. The color conversion layer absorbs the blue emission from the microcavity OLED and re-emits isotropically. The viewing angle dependence is thus improved while the display retains the advantages of improved emission efficiency and chromaticity normally expected from a microcavity OLED device.

Turning now to FIG. 1, there is shown a cross-sectional view of a pixel of an OLED device 10 according to a first embodiment of the present invention. In some embodiments, OLED device 10 can be a subpixel as defined above. Although OLED device 10 is shown as emitting light from the bottom (that is, a bottom-emitting device), it will be understood that in some embodiments OLED device 10 can be a top-emitting device. The pixel includes at a minimum a substrate 20, an anode 30, a cathode 65 spaced from anode 30, and a light-emitting layer 50. The pixel can also include one or more of a color conversion layer 25, a hole-injecting layer 40, a hole-transporting layer 45, an electron-transporting layer 55, and an electron-injecting layer 60. Some embodiments can also include a transparent conductive spacer layer 35. These components will be described in more detail.

Substrate 20 can be an organic solid, an inorganic solid, or a combination of organic and inorganic solids. Substrate 20 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 20 can be a homogeneous mixture of materials, a composite of materials, or multiple layers of materials. Substrate 20 can be an OLED substrate, that is a substrate commonly used for preparing OLED devices, e.g., active-matrix low-temperature polysilicon or amorphous-silicon TFT substrate. The substrate 20 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

Under certain circumstances, OLED device 10 can be a color conversion OLED device and include a color conversion layer 25. Color conversion layer 25 has been described by Tokailin et al. in commonly assigned U.S. Pat. No. 5,126,214. Color conversion layer 25 includes a fluorescent material responsive to the color light emitted by light-emitting layer 50 and is capable of changing the wavelength of light and thereby re-emitting different colored light. It can be particularly useful to form an OLED device that generates light of a single hue (e.g., blue light) and include color conversion layers 25 that convert the generated light into light of one or more different hues (e.g., green, red) that will be perceived by a viewer. Thus, it is possible to construct a full color OLED device with a light-emitting layer that produces only a single hue of light. The fluorescent material to be used in color conversion layer 25 is not critical as long as it has a strong fluorescent in the solid state, including a dispersion state in a resin. The fluorescent material can include coumarin dyes such as 2,3,5,6-1H,4H-tetrahydro-8-trichloromethylquinolizino(9,9a,1 gh)coumarin, cyanine-based dyes such as 4-dicyanomethylene-2-methyl-6-(p-dimethylaminostyrylene)-4H-pyran, pyridine-based dyes such as 1-ethyl-2-(4-(p-dimethylaminophenyl)-1,3-butadienyl)-pyridium perchlorate, xanthene-based dyes such as rhodamine B, and oxazine-based dyes. The fluorescent material can also include inorganic phosphors. The fluorescent material can be in the form of a film formed by vacuum deposition, by sputtering, or by spin coating. In other embodiments, the fluorescent material can be dispersed in a resin such as a bonding resin. The thickness of color conversion layer 25 is not critical as long as it sufficiently absorbs light from light-emitting layer 50.

The positioning of color conversion layer 25 will depend on the properties of OLED device 10. For some embodiments such as a top-emitting device, it will be preferable that color conversion layer 25 will be over cathode 65.

An electrode is formed over substrate 20 and is most commonly configured as an anode 30. When EL emission is viewed through the substrate 20, anode 30 should be made of a reflective metal and should be thin enough so that it has a finite transmittance at the wavelength of the emitted light, hereafter referred to as being semitransparent. Only a small number of metals, including Ag or Au, or alloys thereof, defined as alloys having at least 50 atomic percent of at least one of these metals, are preferable materials for semitransparent anode 30. The thickness range of anode 30 is limited and is selected to optimize the luminance light output at a predetermined wavelength from OLED device 10, as will be further described. In certain circumstances, it is possible to also include a transparent conductive oxide layer in combination with the thin reflective metal layer in anode 30. Since lateral conductance is provided by the thin reflective metal layer, the conductivity of the transparent conductive oxide layer does not have to be high. Suitable materials include indium oxide (InO), tin oxide (SnO), zinc oxide (ZnO), molybdenum oxide, vanadium oxide, antimony oxide (SbO), or mixtures thereof.

Alternatively, when EL emission is viewed through cathode 65, anode 30 is preferably a reflective metal with a thickness that gives an optical density of 1.5 or greater so that it is substantially opaque and reflective. The emission efficiency of the OLED device increases with increasing reflectivity of anode 30. The material for an opaque and reflective anode 30 is preferably selected from, a list including Ag, Au, Al, Mg, or Ca, or alloys thereof.

While not always necessary, it is often useful that a hole-injecting layer 40 be formed over anode 30 in an organic light-emitting display. The hole-injecting material can serve to improve the film formation property of subsequent organic layers and to facilitate injection of holes into the hole-transporting layer. Suitable materials for use in hole-injecting layer 40 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 45 be formed and disposed between anode 30 and cathode 65. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 45 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

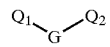

A wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

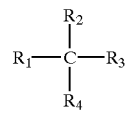

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

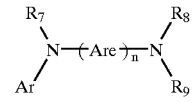

D wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4''-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4''-Bis [N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 50 produces light in response to hole-electron recombination. Light-emitting layer 50 is formed over anode 30 and over any other layers formed, such as hole-transporting layer 45. Desired organic light-emitting materials can be deposited by any suitable means such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant and can be of any color. The dopant is selected to produce color light having a particular spectrum. For a color conversion OLED device, the dopant is frequently selected to produce blue light. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

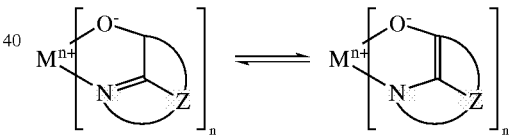

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine[alias,tris(8-quinolinolato) aluminum(III)]
CO-2: Magnesium bisoxine[alias,bis(8-quinolinolato) magnesium(II)]
CO-3: Bis[benzo{f}-8-quinolinolato]zinc (II)
CO-4: Bis(2-methyl-8-quinolinolato)aluminum(II)-μ-oxo-bis(2-methyl-8-quinolinolato) aluminum(III)
CO-5: Indium trisoxine[alias,tris(8-quinolinolato)indium]
CO-6: Aluminum tris(5-methyloxine)[alias,tris(5-methyl-8-quinolinolato) aluminum(III)]
CO-7: Lithium oxine[alias,(8-quinolinolato)lithium(I)]
CO-8: Gallium oxine[alias,tris(8-quinolinolato)gallium(III)]
CO-9: Zirconium oxine[alias,tetra(8-quinolinolato) zirconium(IV)].

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

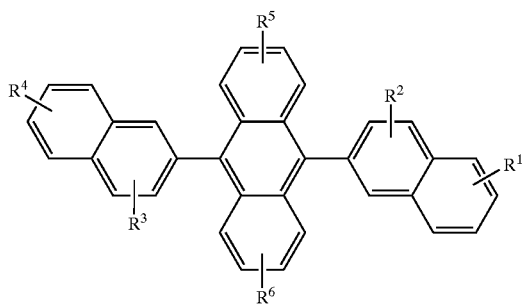

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxyamino, alkylamino, or arylamino of from 1 to 24 carbon atoms; and
Group. 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

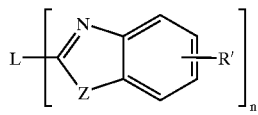

G where:
n is an integer of 3 to 8;
Z is O, NR or S;
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

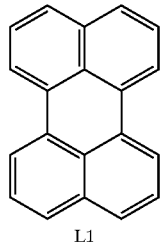

L1

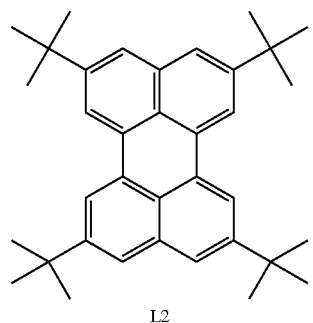

L2

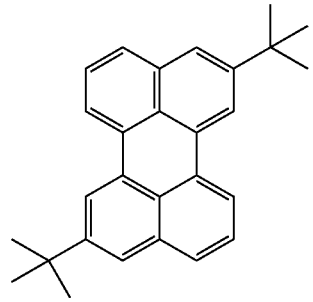

L3

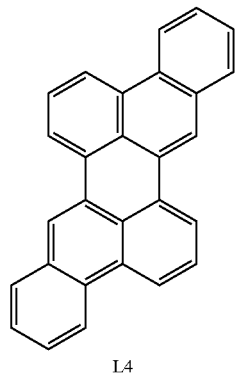
L4
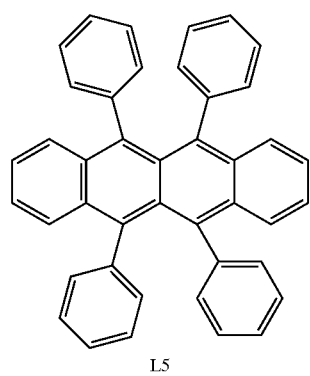
L5
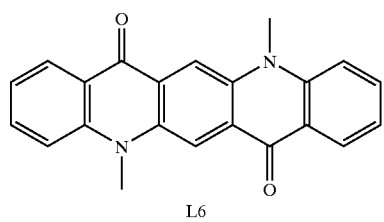
L6
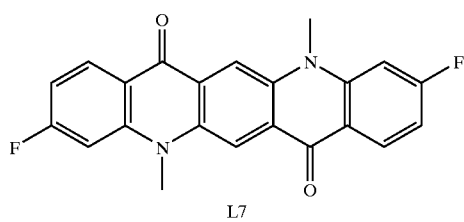
L7
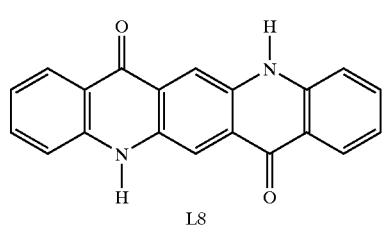
L8
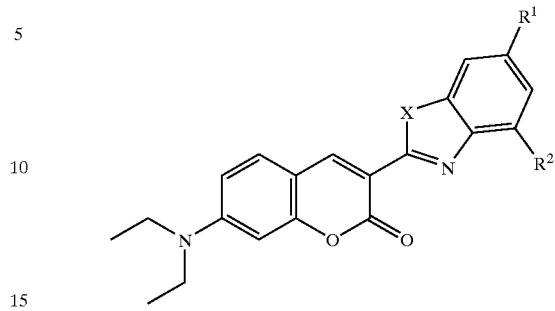
|     | X | R1     | R2     |
|-----|---|--------|--------|
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |
| L18 | S | Methyl | H      |
| L19 | S | Methyl | Methyl |
| L20 | S | H      | t-butyl |
| L21 | S | t-butyl | H     |
| L22 | S | t-butyl | t-butyl |
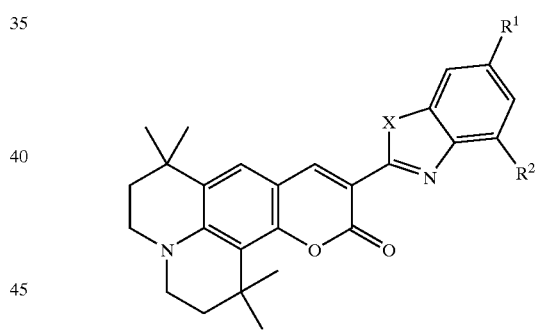
|     | X | R1     | R2     |
|-----|---|--------|--------|
| L23 | O | H      | H      |
| L24 | O | H      | Methyl |
| L25 | O | Methyl | H      |
| L26 | O | Methyl | Methyl |
| L27 | O | H      | t-butyl |
| L28 | O | t-butyl | H     |
| L29 | O | t-butyl | t-butyl |
| L30 | S | H      | H      |
| L31 | S | H      | Methyl |
| L32 | S | Methyl | H      |
| L33 | S | Methyl | Methyl |
| L34 | S | H      | t-butyl |
| L35 | S | t-butyl | H     |
| L36 | S | t-butyl | t-butyl |

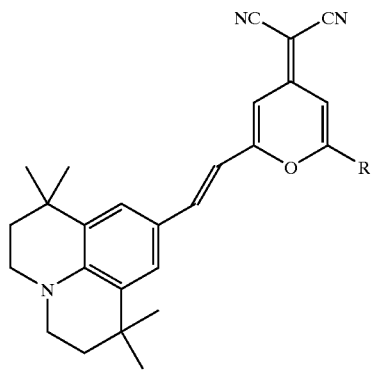

| | R |
|---|---|
| L37 | phenyl |
| L38 | methyl |
| L39 | t-butyl |
| L40 | mesityl |

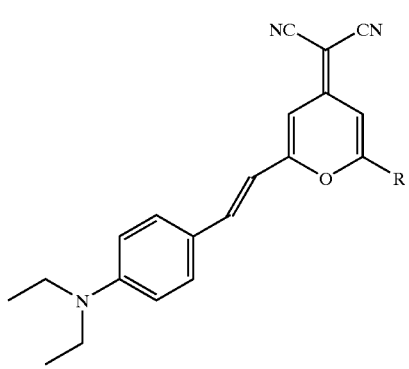

| | R |
|---|---|
| L41 | phenyl |
| L42 | methyl |
| L43 | t-butyl |
| L44 | mesityl |

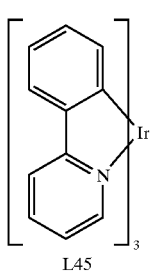

L45

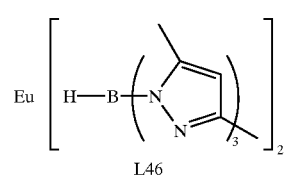

L46

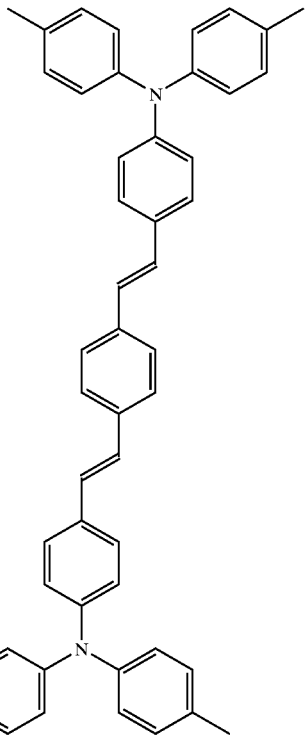

L47

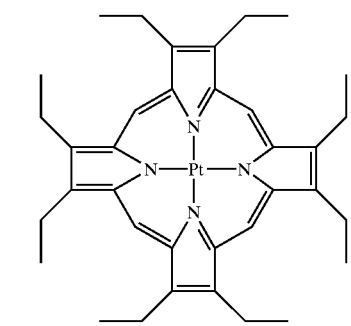

L48

Other organic emissive materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

One advantageous embodiment of the present invention uses a light-emitting layer 50 wherein a dopant is selected to produce light having a spectrum including light of a specific color, and in particular blue light. The use of an array of color conversion layers 25 with fluorescent materials responsive to blue light can convert portions of the blue light into different color light, e.g., red and green.

Although not shown, the device can additionally comprise two or more emissive layers, if such is desired for proper emissive properties of the resulting OLED device. The device can also be in a stacked structure, as disclosed in U.S. Pat. Nos. 6,107,734; 6,337,492; and 6,274,980.

While not always necessary, it is often useful that OLED device 10 includes an electron-transporting layer 55 formed over light-emitting layer 50. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 55 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g., polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

It will be understood that, as is common in the art, some of the layers described above can have more than one function. For example, light-emitting layer 50 can have hole-transporting properties or electron-transporting properties as desired for performance of the OLED device. Hole-transporting layer 45 or electron-transporting layer 55, or both, can have emitting properties. In such a case, fewer layers can be sufficient for the desired emissive properties.

An electron-injecting layer 60 can also be present between the cathode and the electron-transporting layer. Examples of electron-injecting materials include alkaline or alkaline earth metals, alkali halide salts, such as LiF mentioned above, or alkaline or alkaline earth metal doped organic layers.

Cathode 65 is an electrode formed over the electron-transporting layer 55, or over light-emitting layers 50 if an electron-transporting layer is not used. When light emission is through anode 30, the cathode 65 material is preferably a reflective metal with a thickness that gives an optical density of 1.5 or higher so that it is essentially opaque and reflective. The emission efficiency of the OLED device increases with increasing reflectivity of cathode 65. The material for an opaque and reflective cathode 65 is preferably selected from a list including Ag, Au, Al, Mg, or Ca, or alloys thereof.

Alternatively, when light emission is viewed through cathode 65, cathode 65 needs to include a reflective metal that is thin enough such that it is semitransparent to the emitted light. The material for a semitransparent cathode 65 is preferably selected from a list including Ag or Au, or alloys thereof. The thickness range of cathode 65 is limited and is selected to optimize the luminance light output at a predetermined wavelength from OLED device 10, as will be further described. In certain circumstances, it is possible to also include a transparent conductive oxide layer in combination with the thin reflective metal layer in cathode 65. Since lateral conductance is provided by the thin reflective metal layer, the conductivity of the transparent conductive oxide layer does not have to be high. Suitable materials include indium oxide (InO), tin oxide (SnO), zinc oxide (ZnO), molybdenum oxide, vanadium oxide, antimony oxide (SbO), or mixtures thereof.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 65 is vertically spaced apart from anode 30. Cathode 65 can be part of an active matrix device and in that case is a single electrode for the entire display. Alternatively, cathode 65 can be part of a passive matrix device, in which each cathode 65 can activate a column of pixels, and cathodes 65 are arranged orthogonal to anodes 30.

Anode 30 and cathode 65 form a Fabry-Perot microcavity that effectively limits the bandwidth of the emitted light spectrum to produce light of a specific color. Emission near the wavelength corresponding to the resonance wavelength of the cavity is enhanced through the semitransparent electrode and those with other wavelengths are suppressed.

FIG. 1 also shows schematically the effect of light emission in a microcavity. For simplicity, hole-injecting layer 40, hole-transporting layer 45, light-emitting layer 50, electron-transporting layer 55, and electron-injecting layer 60 will be referred to collectively as organic EL element 9.

In accordance with the present invention, the thickness of the organic EL element 95 can be varied in order to adjust the microcavity resonance wavelength. A transparent conductive spacer layer 35 can be used as an additional means to adjust the microcavity resonance wavelength. Transparent conductive spacer layer 35 can be disposed between one of the metallic electrodes and organic EL element 95. It needs to be transparent to the emitted light and it needs to be conductive to carry the charge carriers between the metallic electrode and the organic EL element 95. Since only through-film conductance is important a bulk resistivity of less than about $10^8$ ohm-cm is adequate. Many metal oxides such as, but not limited to, indium-tin oxide (ITO), zinc-tin oxide (ZTO), tin-oxide (SnOx), indium oxide (InOx), molybdnum oxide (MoOx), tellurium oxide (TeOx), antimony oxide (SbOx), and zinc oxide (ZnOx), can be used.

In this embodiment, light is shown as being emitted at the interface of hole-transporting layer 45 and light-emitting layer 50. Light 105 is emitted in the direction of reflective cathode 65 and is reflected as reflected light 110. Light 115 is emitted in the direction of semitransparent reflective anode 30 and is partially reflected as partially reflected light 120, and partially transmitted as partially transmitted light 125. Partially transmitted light 125 can be absorbed by color conversion layer 25 and re-emitted as emitted light 130 of a different hue.

The combined thickness of the organic EL element 95 and transparent conductive spacer layer 35 (if present) is selected to tune the microcavity OLED device 10 to have the resonance at the predetermined wavelength to be emitted from the device. The thickness satisfies the following equation:

$$2\Sigma n_i L_i + 2 n_s L_s + (Q_{m1} + Q_{m2})\lambda/2\pi = m\lambda \qquad \text{Eq. 1}$$

wherein $n_i$ is the refractive index and $L_i$ is the thickness of the nth sublayer in organic EL element 95; $n_s$ is the refractive index; and $L_s$ is the thickness, which can be zero, of the transparent conductive spacer layer 35; $Q_{m1}$ and $Q_{m2}$ are the phase shifts in radians at the two organic EL element-metal electrode interfaces, respectively; $\lambda$ is the predetermined wavelength to be emitted from the device; and m is a non-negative integer. It is preferred to have m as small as practical, typically less than 2. By selecting the predetermined emitted wavelength to be the wavelength of the light-emitting layer 50, one can reduce the intensity of light produced by dopants added to stabilize the light-emitting layer 50. For example, in the above-mentioned example of a blue-light-emitting layer stabilized by the presence of a yellow-emitting dopant such as a rubrene derivative in hole-transporting layer 45, one can select the microcavity effect to enhance the emission of blue light (as transmitted light 125) and reduce the emission of undesirable yellow wavelengths.

The total thickness between the metal electrodes is the most important factor in determining the microcavity resonance wavelength. However, the resonance wavelength and more particularly the strength of the resonance (and thus the resulting efficiency of the device) also depend on the distance between the emitting layer and each of the two electrodes. In particular, for optimal device performance, the distance between the metallic reflective cathode 65 and (the center of) the emitting layer should roughly satisfy the following equation:

$$2\Sigma n_i L_i + Q_{m1}\lambda/2\pi = m_D \lambda \qquad \text{Eq. 2}$$

wherein $n_i$ is the refractive index and $L_i$ is the thickness of the nth sublayer in organic EL element 95; $Q_{m1}$ is the phase shift in radians at the organic EL element-metal cathode interface; $\lambda$ is the predetermined wavelength to be emitted from the device; and $m_D$ a non-negative integer. Note that, in contrast to Eq. 1, the sum here is only over those layers that lie between (the center of) the emitting layer and the metallic reflective cathode 65. The thickness of the transparent conductive spacer layer 35 should be included if it is disposed between light-emitting layer 50 and reflective cathode 65. One can write an analogous equation for the distance between the metallic semitransparent reflective anode 30 and the emitting layer. However, since satisfaction of Eqs. 1 and 2 guarantees the satisfaction of this third equation, it does not provide any additional constraint.

Since it is desirable that the absorption of light by the metallic semitransparent reflective anode 30 be as low as feasible, a useful addition is an absorption-reduction layer between the metallic semitransparent reflective anode 30 and substrate 20. The purpose of this layer is to reduce the electric field produced by the light wave (and thus the absorption of the light wave) within the semitransparent reflective anode 30 itself. To a good approximation, this result is best accomplished by having the electric field of the light wave reflected back from the interface between the absorption-reduction layer and the substrate 20 interfere destructively with, and thus partly cancel, the electric field of the light passing out of the device. Elementary optical considerations then imply that this will occur (for an absorption-reduction layer having a higher refractive index than the substrate) when the following equation is approximately satisfied:

$$2n_A L_A + n_T L_T = (m_A + \tfrac{1}{2})\lambda \qquad \text{Eq. 3}$$

where $n_A$ and $L_A$ are the refractive index and the thickness of the absorption-reduction layer, respectively; $n_T$ and $L_T$ are the real part of the refractive index and the thickness of the semitransparent metal bottom anode, respectively; and $m_A$ is a non-negative integer. It is preferred to have $m_A$ as small as practical, usually 0 and typically less than 2. In an alternate configuration of the device, the semitransparent electrode can be the cathode and the metallic reflective electrode can be the anode. In such a case the organic EL element 95 is appropriately oriented so that the hole-injecting and hole-transporting layers are closer to the anode and the electron-injecting and electron-transporting layers are closer to the cathode.

EXAMPLE 1

OLED devices #1, #2, and #3 were constructed in the following manner.

Substrates coated with 80 nm ITO were sequentially ultrasonicated in a commercial detergent, rinsed in deionized water, and degreased in toluene vapor. These substrates were treated with oxygen plasma for about one minute and coated with 1 nm fluorocarbon layer by plasma assisted deposition of $CHF_3$. These substrates were loaded into a deposition chamber for organic layers and cathode depositions.

The devices of Example 1 were prepared by sequential deposition of 150 nm NPB hole-transport layer (HTL) doped with various amounts of rubrene, 20 nm blue emission layer (EML) comprising ADH host with 1.5% TBP blue dopant, 35 nm Alq electron-transport layer (ETL), and 100 nm Mg:10% Ag alloy as the cathode. The above sequence completed the deposition of the OLED device. Device #1 had no rubrene doping into the HTL; device #2 had 0.5% of rubrene doped into the HTL; and device #3 had 2% rubrene doped into HTL.

Figure 2:
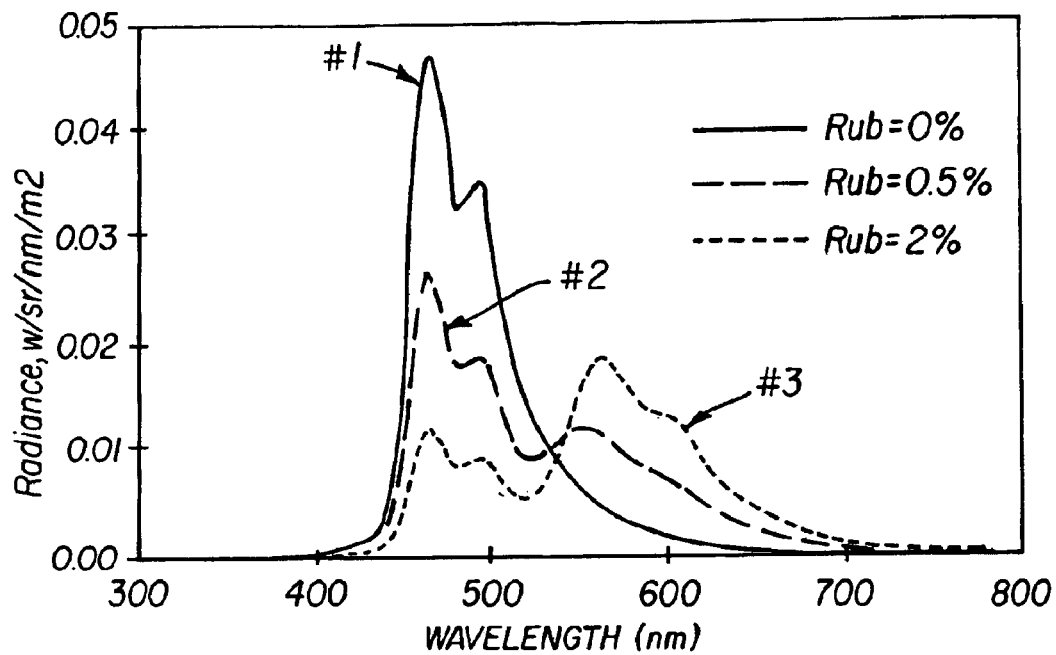
FIG. 2 shows the effect of a stabilizing dopant on the emission spectrum of a conventional (non-microcavity) OLED device.

The OLED devices were then hermetically packaged in a dry glove box filled with nitrogen for protection against ambient environment. The ITO patterned substrates used for preparing these OLED devices contained several test patterns. Each of the devices was tested for current voltage characteristics and the electroluminescence yield. The spectral output of the devices operating at 20 mA/cm$^2$ current density are plotted in FIG. 2. Device #1 showed two emission peaks at 464 nm and 492 nm, respectively, and CIE color coordinates of (0.166,0.253), typical of what normally seen for a blue-emitting OLED device using a TBP doped light emitting layer. Device #2 showed a much different spectrum. In addition to the two peaks at 464 nm and 492 nm, a new peak at 560 nm due to rubrene emission was clearly visible. The CIE color coordinates shifted to (0.245, 0.324) and the emission was no longer blue. Device #3 showed a spectrum that was dominated by the rubrene emission at 560 nm and the color coordinates shifted to (0.383, 0.421). The emission had an orange-white appearance and therefore the blue emission from TBP was greatly contaminated.

Figure 3:
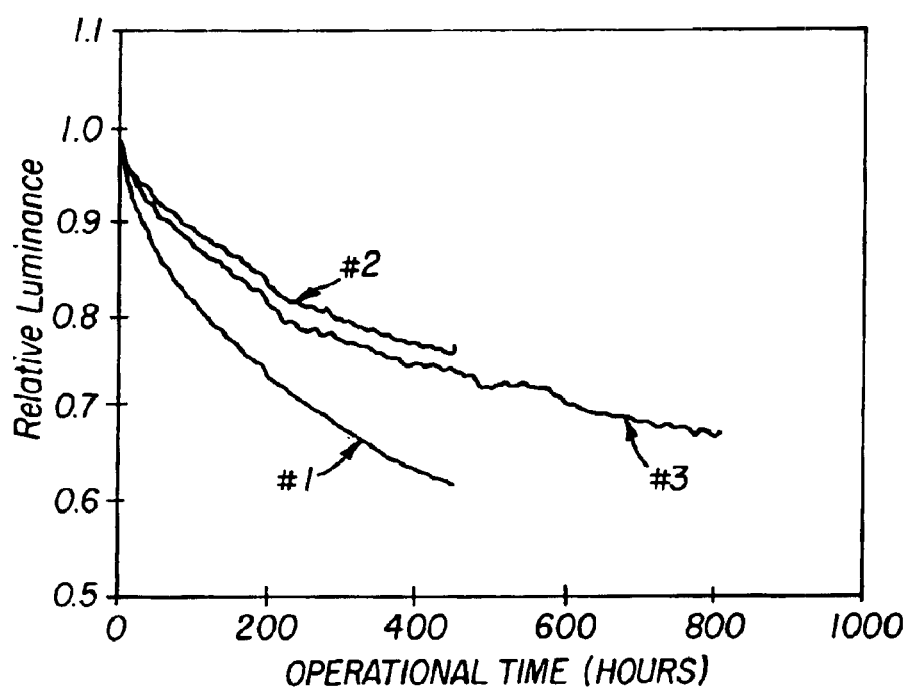
FIG. 3 shows the effect of stabilizing dopant on the stability of an OLED device.

The operation stability was tested by running the devices continuously using 50% duty cycle square waveform AC current at an average current density of 20 mA/cm$^2$. The luminance output was continuously monitored and the output data are plotted in FIG. 3. Device #1 with no rubrene doping in the HTL degraded to 70% of its initial output in about 250 hours; device #2 with 0.5% rubrene doped in the HTL degraded to 70% of its initial output in over 800 hours; and device #3 with 2.0% rubrene doped in the HTL degraded in about 600 hours.

Because of the color contamination, however, these rubrene-stabilized devices could no longer be used as blue-emitting OLED devices. Example 2-a (comparative): OLED devices #2-a was constructed in a manner similar to the samples in Example 1.

A substrate coated with 40 nm ITO was sequentially ultrasonicated in a commercial detergent, rinsed in deionized water, and degreased in toluene vapor. This substrate was treated with oxygen plasma for about one minute and coated with 1 nm fluorocarbon layer by plasma assisted deposition of $CHF_3$. The substrate was then loaded into a vacuum evaporation deposition chamber for sequential deposition of 87 nm of undoped NPB hole-transport layer (HTL), 20 nm of NPB hole-transport layer doped with 2.5% of rubrene, 30 nm blue emission layer (EML) comprising TBADN host with 1.5% TBP blue dopant, 32 nm Alq electron-transport layer (ETL), 0.5 nm Li electron injection layer, and 50 nm Ag alloy as the cathode. The above sequence completed the deposition of the OLED device. The OLED device was then hermetically packaged in a dry glove box filled with nitrogen for protection against ambient environment. The ITO patterned substrate used for preparing these OLED devices contained several test patterns. Each of the devices was tested for current voltage characteristics and the electroluminescence yield. The spectral output of the device operating at 20 mA/cm$^2$ current density is plotted in FIG. 4. Device #2-a showed a spectrum that was dominated by the rubrene emission at 560 nm and the color coordinates are at (0.376, 0.461). The emission had a strong orange-white appearance and therefore the blue emission from TBP was greatly contaminated.

Figure 4:
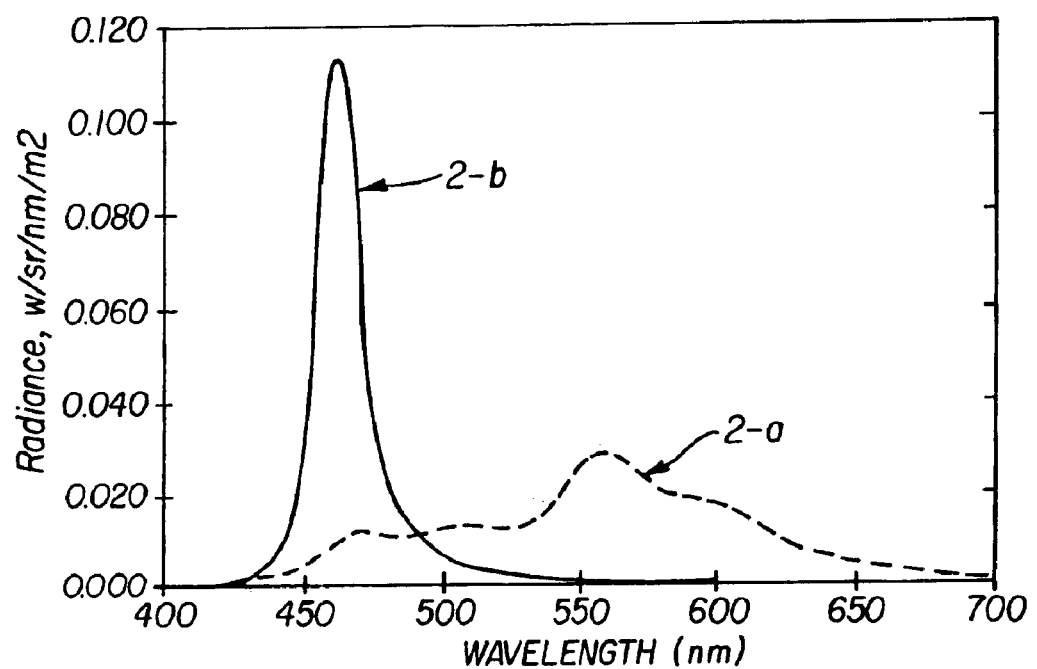
FIG. 4 shows the effect of a microcavity structure according to an embodiment of the present invention in eliminating the contaminating emission from a stabilizing dopant.

Sample 2-b (inventive) was prepared with a microcavity structure. A glass substrate was sequentially ultrasonicated in a commercial detergent, rinsed in deionized water, and degreased in toluene vapor. This substrate was then coated with a DC-sputtered layer of 93 nm thick Ag film through a metal mask to create an anode pattern. The substrate was then placed in a vacuum evaporation deposition chamber for sequential deposition of 3 nm of MoO$_3$ hole injection layer, 139 nm of undoped NPB hole-transport layer (HTL), 20 nm of NPB hole-transport layer doped with 2.5% of rubrene, 20 nm blue emission layer (EML) comprising TBADN host with 1.5% TBP blue dopant, 20 nm Alq electron-transport layer (ETL), 0.5 nm L$_i$ electron injection layer, and 22.5 nm Ag alloy as the semitransparent cathode, and 85 nm Alq as the absorption-reduction layer. The above sequence completed the deposition of the OLED device. The OLED device was then hermetically packaged in a dry glove box filled with nitrogen for protection against ambient environment. The OLED structure formed a microcavity with the Ag anode and the Ag cathode layers as the reflecting mirrors. The thickness of the layers was selected so that the resonance wavelength of the microcavity was in the blue region and the emission had a good efficiency. The spectral output of the device is also shown in FIG. 4. It included a single narrow peak at 460 nm with a color coordinate of (0.145, 0.079). The radiance at 460 nm is almost ten times higher than the non-cavity sample 2-a at this wavelength. The OLED device constructed in accordance with the present invention thus showed much improved color and emission efficiency. The device is expected to maintain the stabilization effect of rubrene doped into HTL but the color contamination due to rubrene doping is completely eliminated.

The invention has been described in detail with particular reference to stabilizing a blue emitting OLED but it will be understood that the invention can be applied to other colored OLED devices as well. The invention has been described in detail with particular references to certain preferred embodiments thereof, but it will be understood that variations and modifications can be effected within the spirit and scope of the invention.

PARTS LIST

10 OLED device
20 substrate
25 color conversion layer
30 anode
35 transparent conductive spacer layer
40 hole-injecting layer
45 hole-transporting layer
50 light-emitting layer
55 electron-transporting layer
60 electron-injecting layer
65 cathode
95 organic EL element
105 light
110 reflected light
115 light
120 partially reflected light
125 partially transmitted light
130 emitted light

What is claimed is:

1. A stabilized OLED device for emitting light of a specific color, comprising:
   a) a metallic anode and a metallic cathode spaced from the metallic anode;
   b) a light-emitting layer including a host and a dopant disposed between the anode and the cathode, the dopant selected to produce light having a spectrum containing light of the specific color;
   c) a stabilizer provided in one of the device layers which improves the useful lifetime of the OLED device, wherein the stabilizer has an emission spectrum different from that of the light-emitting layer, and
   d) wherein one of the electrode layers is semitransparent and the other one is substantially opaque and reflective such that the stabilized OLED device forms a microcavity that emits a narrow band light with the specific color.

2. The OLED device of claim 1 wherein material for the semitransparent electrode layer includes Ag or Au, or alloys thereof.

3. The OLED device of claim 1 wherein the material for the reflective electrode layer includes Ag, Au, Al, Mg, or Ca, or alloys thereof.

4. The OLED device of claim 1 further including a hole-transporting layer disposed between the anode and the cathode.

5. The OLED device of claim 1 wherein the OLED device includes a hole-transporting layer and the stabilizer is provided in the light-emitting layer or the hole-transporting layer or both.

6. The OLED device according to claim 1 further including an electron-transporting layer and a hole-transporting layer and wherein the stabilizer is provided in such electron-transporting layer or in the light-emitting layer or in the hole-transporting layer.

7. The OLED device according to claim 1 wherein the dopant produces blue light.

8. A color-conversion OLED device comprising:
   a) a metallic anode and a metallic cathode spaced from the metallic anode;
   b) a light-emitting layer including a host and a dopant disposed between the anode and the cathode, the dopant selected to produce blue light;
   c) a stabilizer provided in one of the device layers which improves the useful lifetime of the OLED device, wherein the stabilizer has an emission spectrum different from that of te light-emitting layer;
   d) wherein one of the electrode layers is semitransparent and the other one is substantially opaque and reflective such that the stabilized OLED device forms a microcavity that emits a narrow blue band light; and
   e) a color conversion layer including fluorescent material responsive to the blue light to re-emit a different colored light.

9. A color-conversion OLED device of claim 8 wherein material for the semitransparent electrode layer includes Ag or Au, or alloys thereof.

10. The color-conversion OLED device of claim 8 wherein the material for the reflective electrode layer includes Ag, Au, Al, Mg, or Ca, or alloys thereof.

* * * * *